United States Patent
Puri et al.

[11] Patent Number: 6,045,621
[45] Date of Patent: Apr. 4, 2000

[54] METHOD FOR CLEANING OBJECTS USING A FLUID CHARGE

[75] Inventors: Suraj Puri, Los Altos; Raj Mohindra, Los Altos Hills, both of Calif.

[73] Assignee: SCD Mountain View, Inc., Mountain View, Calif.

[21] Appl. No.: 09/179,540

[22] Filed: Oct. 26, 1998

[51] Int. Cl.$^7$ .................................................... B08B 3/04
[52] U.S. Cl. ........................... 134/2; 134/10; 134/11; 134/25.4; 134/25.5; 134/26; 134/30; 134/34; 134/36; 134/95.1; 134/95.2; 134/902
[58] Field of Search ................... 134/2, 10, 11, 134/25.4, 25.5, 26, 30, 34, 36, 95.1, 95.2, 902

[56] References Cited

U.S. PATENT DOCUMENTS

| | | | |
|---|---|---|---|
| 5,571,337 | 11/1996 | Mohindra et al. | 134/25.4 |
| 5,634,978 | 6/1997 | Mohindra et al. | 134/2 |
| 5,651,379 | 7/1997 | Mohindra et al. | 134/95.2 |
| 5,685,327 | 11/1997 | Mohindra et al. | 134/95.2 |
| 5,772,784 | 6/1998 | Mohindra et al. | 134/21 |
| 5,849,104 | 12/1998 | Mohindra et al. | 134/25.4 |
| 5,868,150 | 2/1999 | Mohindra et al. | 134/135 |
| 5,873,947 | 2/1999 | Mohindra et al. | 134/18 |
| 5,878,760 | 3/1999 | Mohindra et al. | 134/95.2 |
| 5,891,256 | 4/1999 | Mohindra et al. | 134/2 |
| 5,932,027 | 8/1999 | Mohindra et al. | 134/21 |
| 5,958,146 | 9/1999 | Mohindra et al. | 134/2 |

*Primary Examiner*—Philip R. Coe
*Assistant Examiner*—S. Carrillo
*Attorney, Agent, or Firm*—Townsend and Townsend and Crew LLP

[57] ABSTRACT

A method for cleaning an object. The method (400) includes immersing (420) an object in a liquid comprising water, which can be ultra-clean. The object has a front face, a back face, and an edge. The method includes providing (450) a cleaning enhancement substance (e.g., trace amount of polar organic compound, surfactant, ammonia bearing compound) into the liquid. In one embodiment, the cleaning enhancement substance can form a liquid film, such as a monolayer overlying an upper surface or level of the liquid. The method also includes providing a substantially particle free environment (e.g., ultra-clean gas, ultra-clean non-reactive gas) adjacent to the front face and the back face of the object as the liquid including the cleaning enhancement substance is being removed.

18 Claims, 9 Drawing Sheets

METHOD FOR CLEANING OBJECTS USING A FLUID CHARGE

BACKGROUND OF THE INVENTION

The present invention relates to the field of semiconductor integrated circuits. The invention is illustrated in an example with regard to a semiconductor integrated circuit cleaning technique, including a method and apparatus, but it will be recognized that the invention has a wider range of applicability. Merely by way of example, the invention can also be applied to the manufacture of raw wafers, lead frames, medical devices, disks and heads, flat panel displays, microelectronic masks, and other applications requiring high purity wet processing such as steps of rinsing, cleaning, drying, and the like.

As line sizes of integrated circuit devices shrink to sub-micron sized dimensions, cleaning and drying wafers become even more critical. A variety of convention techniques exist to rinse and dry a semiconductor wafer. An example of a conventional technique used to rinse a wafer is a cascade rinse. The cascade rinse utilizes a cascade rinser which includes inner and outer chambers, each separated by a partition. Rinse water flows from a water source into the inner chamber. The rinse water from the inner chamber cascades into the outer chamber. A limitation with the cascade rinser is that "dirty water" often exists in the first chamber. The dirty water typically includes residual acid as well as "particles" which often attach to the wafer. These particles often cause defects in the integrated circuit, thereby reducing the number of good dies on a typical wafer. Another limitation with the cascade rinser is wafers from the cascade rinser must still undergo a drying operation. A subsequent drying operation often introduces more particles onto the integrated circuit. More particles on the integrated circuit typically further decrease the number of good dies on the wafer. Accordingly, the cascade rinse often cannot clean or remove particles from the wafer.

A further technique used to both rinse and dry wafers relies upon a spin rinse/dryer. The spin rinse/dryer uses a combination of rinse water spray to rinse and centrifugal force to remove water from the semiconductor wafer. The dry step often removes the water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to certain problems such as greater downtime, wafer breakage, more spare parts, greater costs, among others. A further limitation is static electricity often builds up on the wafers during the spin cycle, thereby attracting even more particles onto the surface of the semiconductor. Accordingly, the spin rinse/drying does not clean or remove particles from the wafer.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. An example of such a technique is described in U.S. Pat. No. 4,911,761, and its related applications, in the name of McConnell et al. and assigned to CFM Technologies, Inc. McConnell et al. generally describes the use of a superheated or saturated drying vapor as a drying fluid. This superheated or saturated drying vapor often requires the use of large quantities of a hot volatile organic material. The superheated or saturated drying vapor forms a thick organic vapor layer overlying the rinse water to displace (e.g., plug flow) such rinse water with the drying vapor. The thick organic vapor layer forms an azeotropic mixture with water, which will condense on wafer surfaces, and will then evaporate to dry the wafer.

A limitation with this type of dryer is its use of the large solvent quantity, which is hot, highly flammable, and extremely hazardous to health and the environment.

As the line size becomes smaller and the complexity of semiconductor integrated circuits increases, it is clearly desirable to have a cleaning technique, including a method and apparatus, that actually removes particles, prevents additional particles, and does not introduce stains on the wafers. The cleaning technique should also dry the wafers, without other adverse results. A further desirable characteristic includes reducing or possibly eliminating the residual water left on wafer surfaces and edges when water is removed (a meniscus). The water left on such surfaces and edges often attracts and introduces more particles onto the semiconductor wafer. The aforementioned conventional techniques fail to provide such desired features, thereby reducing the die yield on the semiconductor during wet processes.

From the above, it is seen that a cleaning method and apparatus for semiconductor integrated circuits that is safe, easy, and reliable is often desired.

SUMMARY OF THE INVENTION

The present invention provides a safe, efficient, and economical method and apparatus to clean an article (or object) such as a semiconductor wafer, photomask, flat panel, hard disk, or other device having a surface. In particular, the present method provides an improved technique that actually removes or reduces the amount of particles from the semiconductor substrate and also effectively cleans the substrate. In an embodiment, the present method provides a fluid charging technique using a cleaning enhancement substance for removing particles from surfaces of semiconductor substrates and the like.

In a specific aspect, the present invention provides a method for cleaning an object such as a semiconductor wafer, hard disk, mask, or other device having a surface area. The present method includes immersing an object in a liquid comprising water, which can be ultra-clean. The object has a front face, a back face, and an edge. The method includes providing a cleaning enhancement substance (e.g., trace amount of polar organic compound, ammonium or ammonia, surfactants, alcohol.) into the liquid. In one embodiment, the cleaning enhancement substance can form a thin layer overlying an upper surface or level of the liquid to charge the liquid. The layer of substance can be extremely thin such as a monolayer or the like. The substance is often a liquid. In a preferred embodiment, the cleaning enhancement substance is introduced after immersing the object, but before any other processing step. The method also includes providing a substantially particle free environment (e.g., ultra-clean gas, ultra-clean non-reactive gas) adjacent to the front face and the back face as the liquid, including the cleaning enhancement substance, is being removed. In an embodiment, the cleaning enhancement substance dopes the liquid which is attached to the front face and the back face to cause a concentration gradient of the cleaning enhancement substance in the attached liquid to accelerate fluid flow of the attached liquid off of the object.

Another aspect of the invention provides an apparatus for cleaning an object, e.g., semiconductor wafer. The present apparatus includes a vessel adapted to immerse an object in a liquid comprising water, which can be ultra-clean. This object includes a front face, a back face, and an edge. The apparatus also includes a first control valve operably coupled to the vessel, and adapted to provide a substantially particle free environment adjacent to the front face and the back face as the liquid is being removed. A second control valve operably coupled to the vessel also is provided. The second control valve is adapted to form a layer of cleaning enhancement substance (e.g., polar organic compound, ammonia or ammonium, surfactant, alcohol diacetone alcohol) overlying the liquid level. In one embodiment, the cleaning enhancement substance dopes the liquid which is attached to the front face and the back face to cause a concentration gradient of the cleaning enhancement substance in the attached liquid to accelerate fluid flow of the attached liquid off of the object.

Numerous advantages are achieved over conventional techniques using the present invention. In one embodiment, the present invention can be implemented using simple tools and the like. Additionally, the present invention achieves higher device yields by providing for a cleaner and more efficient process, which actually removes particles, rather than introducing them. Furthermore, the present invention can be implemented using standard equipment, without substantial modifications. The present invention generally uses extremely "dilute" chemistries, which are cost effective and safe to use. In some embodiments, the present method is substantially free from solvent vapors or the like. Depending upon the embodiment, one or more of these advantages can be present. These and other advantages, however, will be described in more detail below.

A further understanding of the nature and advantages of the present invention may be realized by reference to the latter portions of the specification and attached drawings.

DESCRIPTION OF THE SPECIFIC EMBODIMENTS

Figure 1:
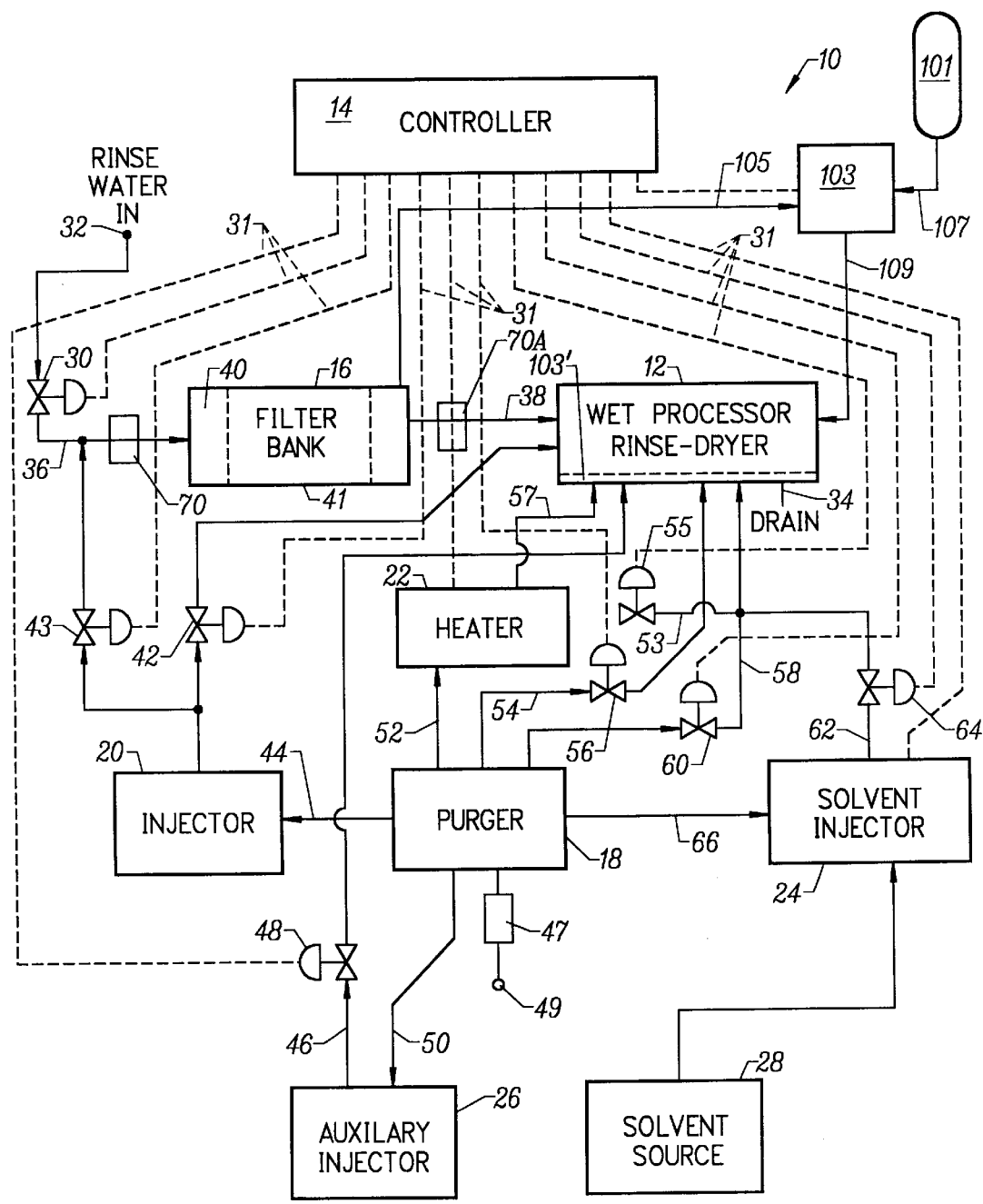
FIG. 1 is a simplified block diagram of a cleaning system according to an embodiment of the present invention.

FIG. 1 illustrates in block diagram form an embodiment of the cleaning system 10 according to the present invention. The cleaning system 10 includes elements such as a wet processor 12, a controller 14, a filter bank 16, a purger 18, an injector 20, a heater 22, a solvent injector 24, an auxiliary injector 26, and a solvent source 28. The system also includes a plurality of flow control valves 30. Each of the flow control valves is operably coupled to the controller 14 and at least one of the aforementioned elements, as shown by dashed lines 31. The solid lines represent lines used to transfer fluids between each of the system elements. A rinse water source 32 and drain 34 are also shown.

Rinse water enters the system at the rinse water source 32. A control valve at the rinse water source 32 controls the flow of rinse water via the controller 14, operably coupled to the control valve 30. The rinse water is a filtered liquid such as deionized (DI) water, among others. Typically the DI water originates from a DI water pad, often outside a wafer fabrication plant.

The filter bank can be any suitable combination of filters, typically used for point of use applications. The filter bank connects to the rinse water source through a line 36 and connects to the wet processor through a line 38. The filter bank includes an ion exchange module 40, a combination of charged and neutral filters 41, among others. This filter bank provides point of use ultra-purified water. The ultra-purified water is substantially free from particles greater than about 0.5 microns, and preferably greater than about 0.2 microns, and more preferably greater than about 0.1 microns.

Examples of charged filters are described and illustrated in Application Ser. No. 08/285,316, filed Aug. 3, 1994, entitled METHOD AND APPARATUS FOR DELIVERING ULTRA-LOW PARTICLE COUNTS IN SEMICONDUCTOR MANUFACTURING (hereinafter "ULTRA-LOW PARTICLE COUNTS") assigned to the present assignee, and hereby incorporated by reference for all purposes. The filter bank provides for ultra-purified DI water with particles no greater than 0.5 microns in diameter, and preferably 0.2 microns in diameter and less and more preferably 0.1 microns in diameter and less and more preferably 0.05 microns in diameter and less.

The filter bank also provides for a nominal pressure drop therethrough. The pressure drop is less than about 15 pounds per square inch, and preferably less than about 5 pounds per square inch. A higher flow rate is achieved through the filter bank without auxiliary pumps or flow/pressure enhancing devices. Of course, other filters capable of providing ultra-purified water for point of use applications can be used depending upon the application.

The injector 20 can be any suitable injector for reducing or preferably eliminating metal contaminants from lines and system elements. Preferably, the injector 20 is a hydrochloric acid injector. An example of an injector is discussed in ULTRA-LOW PARTICLE COUNTS. The injector connects to the wet processor 12. A control valve 42 meters the acid into the wet processor 12, and a control valve 43 meters the acid into the filter bank 16. Preferably, the controller 14 meters such acid into the system elements such as the wet processor 12 and the filter bank 16, among others during system maintenance, and other desirable times. The injector also connects via line 44 to the purger 18. The purger provides clean pressurized gas to the injector to allow such acid to be introduced into the aforementioned system elements without other auxiliary devices.

Of course, the type of injector used depends upon the particular application.

A use of another chemical such as a solvent, hydrogen peroxide, surfactant, cleaning solution, or the like is optionally introduced through the auxiliary injector 26. The auxiliary injector connects to the wet processor through a line 46, and is controlled by a control valve 48 operably coupled to the controller 14. A purger supplying pressurized gas also connects to the auxiliary injector 26 through a line 50. An example of an auxiliary injector and its operation is also illustrated in the ULTRA-LOW PARTICLE COUNTS. Of course, the type of auxiliary injector used depends upon the particular application.

A further system element is the purger 18, often used to supply gas and/or a pressure head to certain system elements such as the wet processor and others. The purger can be any suitable type of pressure reduction and/or control means capable of supplying the source gas to certain system elements at the desired pressure and flow rate. The purger connects to a source gas 49, which is often a carrier gas used in the cleaning system.

Purger 49 also couples to filter 47 before the gas source. This filter 47 is capable of high flow rates, e.g., 1500 standard liters/minute and greater. Filter 47 also has a retention rating at 0.003 microns. Preferably, no less than about 99.9999999% of particles are removed by way of filter 47. The filter 47 is coupled between the facilities and cleaning system 10. The filter 47 is located before or immediately before the cleaning system 10. In one embodiment, the filter 47 is attached to the cleaning system, but also can be at other locations. This filter provides for a substantially particle free environment. That is, the gas is substantially free from particles greater than about 0.2 microns, or greater than about 0.1 microns, or greater than about 0.05 microns, or greater than about 0.025 microns, or more preferably greater than about 0.01 microns and less. An example of such a filter is product made by Wafergard T-Line Cartridge Filters. Of course, other filters can be used depending upon the application.

Preferably, the carrier gas is an ultra-purified or electronic grade nitrogen gas, or any suitable carrier gas capable of carrying a cleaning enhancement substance (e.g., a trace of polar organic compound, alcohol, surfactant, ammonia) into the wet processor at a desired temperature, pressure, and flow rate. The suitable carrier gas also includes a high purity level to prevent contamination of the system elements. An example of a purger is illustrated in ULTRA-LOW PARTICLE COUNTS. The carrier gases (or gas) is also ultra-clean or substantially free from particles greater than about 0.1 microns and preferably greater than about 0.05 microns. As previously noted, the purger also supplies pressurized carrier gas to the bubbler 20 and auxiliary injector 26 through lines 44 and 50, respectively. The purger further supplies gas to the wet processor through certain alternative routes.

A typical route connects the purger 18 to the wet processor 12 through the heater 22 via lines 52 and 57. In this route, the gas can be heated at the heater 22 before entering into the wet processor 12 through the line 57. The heater can be any suitable commercially available or custom made heater capable of heating the gas such as nitrogen to a temperature at the wet processor 12 greater than 70° and preferably greater than 150° F., but no greater than 200° F. The controller is operably coupled to the heater to adjust the temperature of the gas and turn-on and turn-off the gas at the desired times. Preferably, however, the gas is at room temperature, and is not heated. The controller also meters the gas into the wet processor at a desired flow rate and time.

Alternatively, the heated gas (a carrier gas) connects to the solvent bubbler 24 through a line 53, before entering the wet processor 12. The heated carrier gas mixes and dilutes solvent from the solvent bubbler 24 before entering the wet processor 12. The controller 14 is operably coupled to a control valve 55 to meter the heated carrier gas to the wet processor 12. Another alternative route connects the purger 18 directly to the wet processor 12 through a line 54. The controller 14 is operably coupled to a control valve 56 to turn-on and turn-off the gas at the desired times. The controller 14 and the control valve 56 also meter the gas into the wet processor 12 at a desired flow rate and time.

In a further alternative route, the purger 18 connects to the solvent bubbler 24 through a line 58 before entering the wet processor 12. In this route, the carrier gas mixes with solvent (a cleaning enhancement substance) from the solvent bubbler 24 before entering the wet processor 12. The controller is operably coupled to a control valve 60 that meters the carrier gas to the wet processor through the line 58. In one embodiment, the carrier gas contains a trace of polar organic solvent. This carrier gas contains a cleaning enhancement substance which increases fluid flow and cleans off objects to be cleaned. Of course, the use of any of these configurations or combinations of such configurations depends upon the particular application.

The controller 14 can be any suitable microprocessor based programmable logic controller, personal computer controller, or the like for process control. A suitable controller includes features such as programmability, reliability, flexibility, and durability from corrosive elements. The suitable controller includes various input/output ports used to provide connections to open and close valves, regulate and meter fluids, among other features. The controller also includes sufficient memory to store process recipes for desired applications. An example of a suitable controller is illustrated in the ULTRA-LOW PARTICLE COUNTS. Of course, the type of controller used depends upon the particular application.

The solvent bubbler 24 supplies a carrier gas comprising a trace amount of polar organic compound (a cleaning enhancement substance) to the wet processor 12 through line 62. Preferably, the cleaning enhancement substance is a trace of solvent. The purger 18 supplies the carrier gas to the solvent bubbler through line 66. To regulate or meter the flow of the solvent into the wet processor, the controller operably couples a control valve 64 connected to the line 66, attached to the solvent bubbler. The system also provides the solvent source 28 such as a bottle or canister of the desired chemical.

Figure 2A:
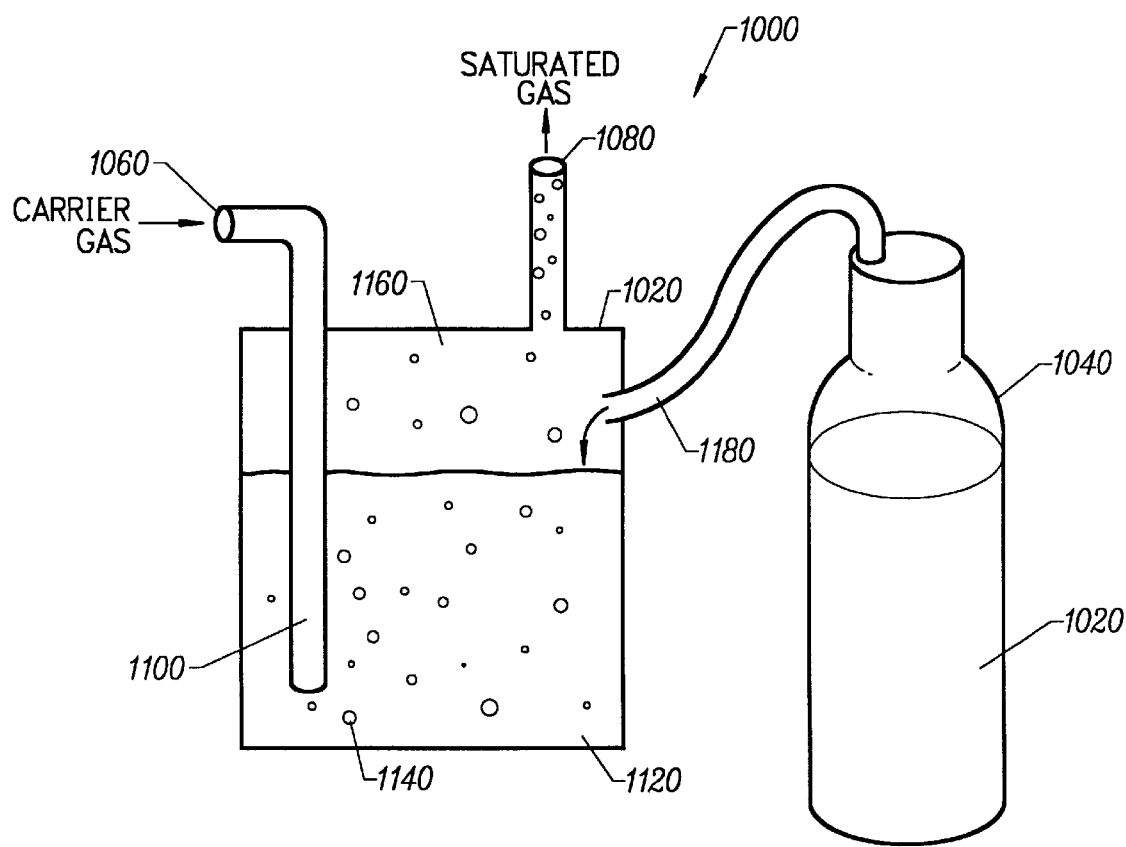
FIG. 2A is a simplified cross-sectional view diagram of a solvent injector according to an embodiment of the present invention.

The solvent bubbler can be any suitable solvent bubbler system for use with the wet processor, carrier gas, and solvent. An example of a solvent bubbler system is represented by the simplified illustration of FIG. 2A. The solvent bubbler system 1000 includes a solvent bubbler vessel 1020 and a solvent source 1040. The solvent bubbler vessel 1020 connects to a carrier gas source at an inlet 1060. A sparger 1100 sparges carrier gas 1140 as bubbles into the solvent 1120 at a lower portion of the solvent bubbler vessel. As the carrier gas bubbles float up through the solvent, the carrier gas bubbles accumulate with solvent. Carrier gas bubbles with solvent escape into the vapor head space 1160 of the solvent bubbler vessel 1020, and exit the solvent bubbler vessel through outlet line 1080. This carrier gas with solvent generally behaves according to ideal gas laws or the like. A solvent fill inlet 1180 also is connected to the solvent bubbler vessel 1020. A solvent source 1040 and solvent 1200 are further shown. Alternatively, the solvent can be introduced into the carrier gas by mechanical means, e.g., ultrasonic, megasonic, mister. The solvent can be introduced into the head space of the chamber or can be introduced directly to the liquid in the chamber, depending upon the application.

The solvent can also be introduced near a liquid level of the liquid as well as underlying the liquid level. In some embodiments, the solvent enters the chamber as a liquid where substantially no solvent vapor is present in the chamber.

In a preferred embodiment, the present cleaning system 10 has an ammonia gas injector 103, which is coupled to an ammonia gas source 101 and an ultra clean DI water source 105. The ammonia gas injector converts gaseous ammonia into an ammonium solution. The ammonium solution is derived from the injector 103, and transfers into the wet processor 12. The injector is controlled via controller 14, which selectively injects gaseous ammonia into DI water. In a specific embodiment, the ammonia gas injector is placed within five feet or ten feet or fifteen feet from the process chamber to provide a substantially pure and clean ammonium solution to the process chamber. The ammonium hydroxide solution can be an anhydrous ammonium hydroxide solution that is combined with water. Alternatively, the injector can be placed within the process chamber 103'.

Figure 2B:
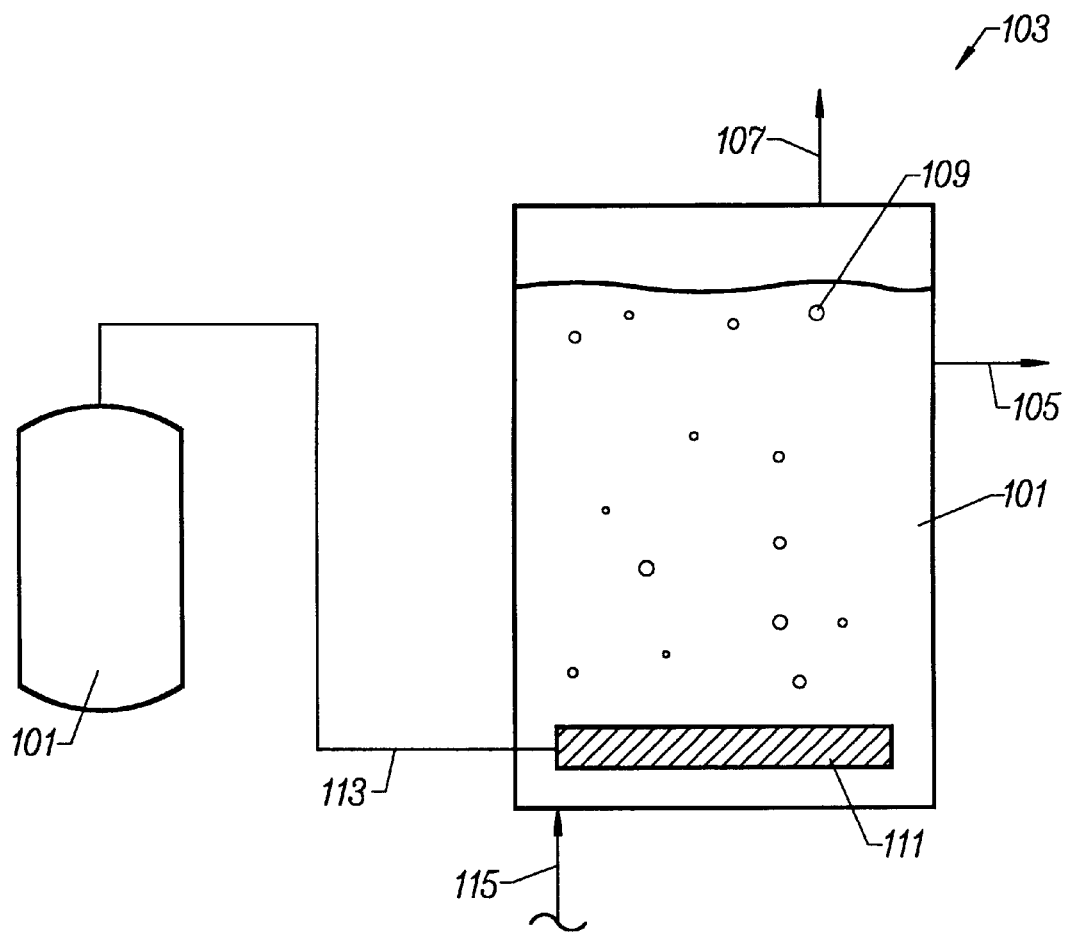
FIG. 2B is a simplified cross-sectional view diagram of an ammonia injector according to an embodiment of the present invention.

A detailed diagram of the ammonia gas injector 103 is shown in FIG. 2B. This diagram is merely an illustration and should not limit the scope of the claims herein. One of ordinary skill in the art would recognize other variations, modifications, and alternatives. The injector 103 holds fluid to be used to treat objects such as semiconductor wafers in the process chamber. Among other features, the injector has a chamber body, which holds a fluid such as a liquid. An incoming stream 115 of liquid such as ultra clean DI water enters the process chamber. A sparger or diffuser 111 can be disposed near a bottom portion of the chamber. The sparger is connected to a pipe or tube 113, which connects to a source. The source can be a variety of liquids or gases, but is preferably ammonia gas 101. Ammonia gas enters the chamber through the sparger and rises upwardly. As the ammonia gas bubbles rise through the DI water, the water mixes with the gas and forms ammonium hydroxide, which is soluble in the DI water. A solution including the ammonium hydroxide leaves 105 the chamber through a pipe or tube. Remaining gas leaves 107 the chamber to an exhaust or recycle.

The fluid can be provided to the gas injector, for example, by perfluoroalkoxylvinylether ("PFA") tubes or pipes, polytetrafluoroethylene ("PTFE") tubes or pipes, polyvinylidene fluoride ("PVDF") tubes or pipes, or quartz tubes. Preferably, PFA tubes or pipes are utilized. In a specific embodiment, PFA tubes are connected to the gas injector with a flared fitting connection. In one embodiment, the device for providing a fluid is through a feed line at a bottom of the injector with the fluid flowing in an upwardly direction into the injector.

In a specific embodiment, the gas diffuser can be any suitable device which provides fine bubbles of ammonia gas into the chamber. The diffuser should uniformly distribute the gas throughout the chamber. The bubbles which are provided by the diffuser are initially about 25 to about 40 microns in diameter, but can be at other diameters to facilitate the conversion of ammonia gas into ammonium hydroxide, for example.

The gas diffuser can include a composite element having a permeable member and a non-permeable member. The permeable member has a top portion and a bottom portion, an open space in a center portion of the permeable member, and a trench positioned on the top portion of the permeable member between an outer periphery of the permeable member and the open space. The impermeable member has an open space in a center portion of the impermeable member which corresponds to an open space in a center portion of the permeable member. The permeable member and the impermeable member are joined such that the trench on the top portion of the permeable member is positioned between the permeable member and the impermeable member. The composite element is preferably positioned with the bottom portion of the permeable member connected to the bottom of the tank, but is not limited to the bottom of the tank. Thus, the permeable portion of the composite element faces toward the bottom of the tank and the impermeable portion of the composite element faces toward the top of the tank. The open portion of the trench is between the two members on the inside of the composite element.

The gas diffuser operates by allowing gas received into the diffuser to diffuse through the pores of the permeable member into the fluid solution. The gas first flows into the trench portion of the permeable member since that area offers the least resistance to the flow of gas. As the gas pressure increases, the gas which has flowed into the trench diffuses through the pores of the permeable member out into the tank. Since the impermeable member on top of the permeable member prevents the flow of gas out the top of the diffuser, the gas diffuses out the bottom and sides of the diffuser, flowing downward. When the fluid is provided at the bottom of the tank, this downward flow of the gas is countercurrent to the flow of fluid, allowing for absorption of the gas into the fluid flowing upwardly into the tank.

It may be desirable for the diffuser to be hydrophobic to prohibit water back streaming into the gas lines which may lead to metal corrosion at the gas regulation box. Moreover, the diffuser should be chemically compatible with ammonia and chemically pure to avoid entrainment of cations, anions or particles into the process bath.

The gas diffuser can be made from a mixture of polytetrafluoroethylene (PTFE) and perfluoroalkoxylvinylether (PFA). By varying the temperature and pressure under which the mixture is prepared by suitable methods, both porous and nonporous members are formed. The impermeable and permeable members are about 95% PTFE and about 5% PFA. The permeable member and the impermeable member may be joined by any number of methods as long as the result is a composite member that will not come apart under the stresses in the tank. The members are heat sealed together, essentially melting or fusing the members together using carbon-carbon bonds. Once the permeable member is formed, a trench is bored out of the PTFE in the top portion of the member. The resulting diffuser has on the order of about 100,000 pores of a size of about 25 to about 40 microns in diameter through which gas may permeate into the treatment tank. The use of the trench in the diffuser allows the gas to diffuse into the tank as very fine bubbles which can be easily absorbed into the fluid and uniformly distributed throughout the tank. As merely an example, the gas diffuser can be one made by a company called Legacy Systems, Inc. of California. U.S. Pat. No. 5,464,480, which is assigned to Legacy Systems, Inc., and is hereby incorporated by reference, describes a gas diffuser.

Although the above has been described in general with regard to one type of gas diffuser and injection system, other types of systems can be used. For example, the gas diffuser can be one made by a PFA/PTFE filter media, which provides a large or suitable surface area for contacting gas and liquid phases.

Figure 3:
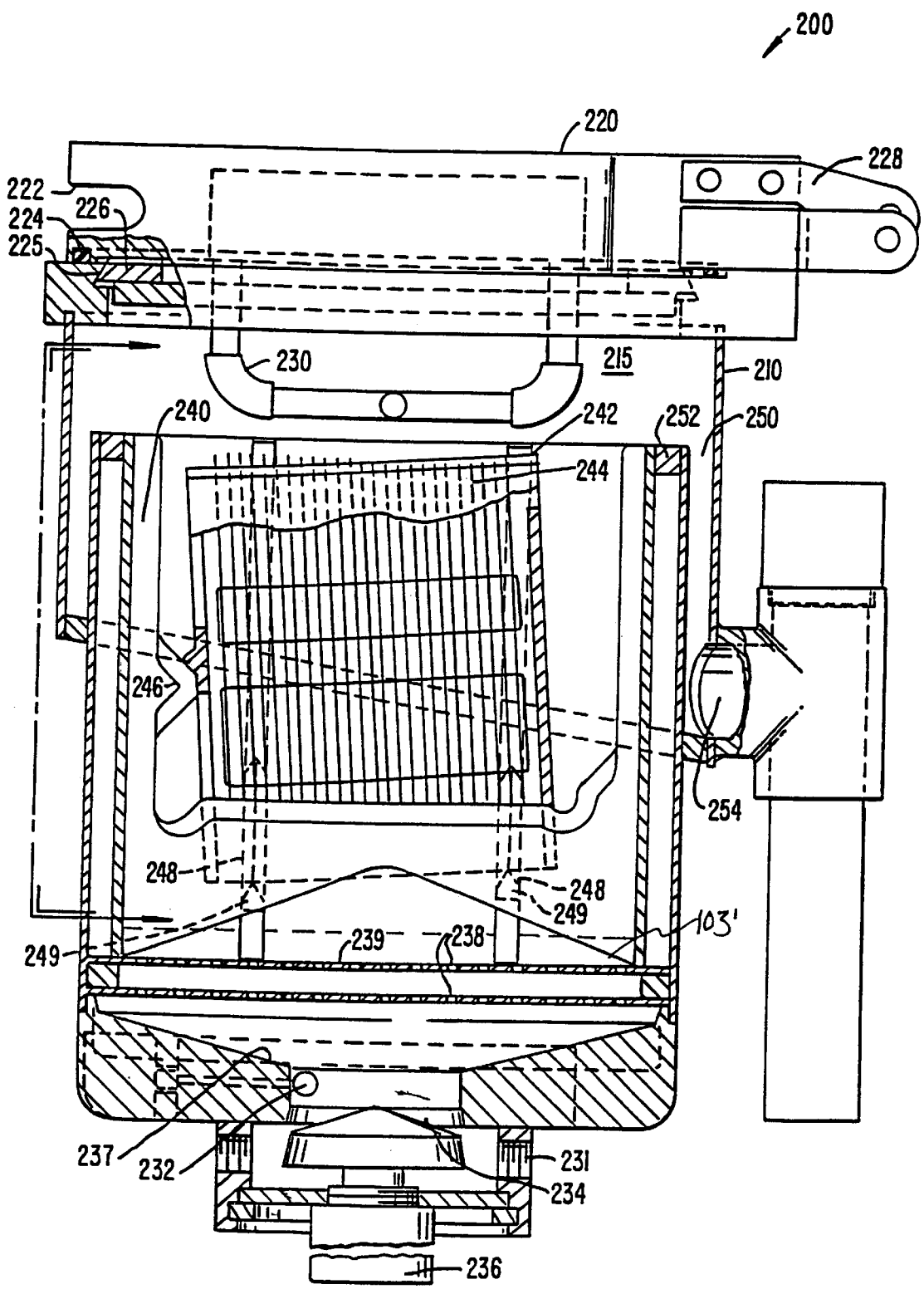
FIG. 3 is a simplified cross-sectional side-view of an embodiment of the cleaning chamber.

FIG. 3 is a simplified cross-sectional side-view 200 embodiment of the cleaning chamber according to the present invention. The side-view embodiment 200 includes a main chamber 210, a lid 220, a lower drain region 231, and other elements. The main chamber 210 includes the process region 240 (or lower chamber region) and upper chamber region 215. A cascade drain region 250 also is shown. Of course, other chamber elements also may be present depending upon the particular application.

The lid 220 is preferably a sealed lid, but does not need to be sealed. The sealed lid includes a handle 222, O-ring type seal 224, a compression ring 226, a hinge 228, a gas inlet 230, among other features. The compression ring 226 provides outward force onto a horizontal portion 225 of the main chamber housing to seal the contents of the main chamber. The O-ring type seal 224 provides a horizontal seal between vertical surfaces of the lid and main chamber housing. The gas inlet 230 includes at least a carrier gas inlet and solvent gas inlet. Of course, the exact configuration of the gas inlet depends upon the particular application.

The process region 240 includes a substrate carrier 242, substrate carrier support 246, 248, and substrate support 249. As will be described in greater detail below, the substrate carrier and substrate support are configured and arranged to minimize liquid accumulation as liquid is drained away in the drying process.

In a specific embodiment, the substrate carrier is a wafer boat or alternatively a half wafer boat or any other type of substrate carrier with a lower profile. The half wafer boat or lower profile boat holds or accumulates less liquid than its full boat counterpart, and therefore drains liquid faster and more easily. The carrier includes substrates (e.g., wafers) 244 disposed within the supports of the carrier. The carrier is supported by a side substrate carrier support 246 and bottom substrate carrier support 248. The side substrate carrier support holds the substrate carrier in place, and prevents such substrate carrier from excessive movement. As shown, the bottom substrate support tilts the substrate carrier in a slight angle from a horizontal position. The angle tends to prevent substrates from sticking to each other during certain rinse and dry operations. The angle from the horizontal position ranges from about 2° to about 15°, and is preferably determined by the characteristics of the particular carrier. By keeping each of the substrates separated, liquid does not accumulate therebetween, thereby decreasing the amount of liquid and therefore particles from accumulating on the substrate.

Each substrate carrier support includes a contact point on the substrate carrier to drain liquid such as water from the substrate carrier surface. The contact point is typically a knife edge, serrated edge, or any other shape that breaks the surface tension of the liquid on the substrate carrier surface. By breaking the surface tension of the liquid on the substrate carrier, the liquid with particles drains (or "wicks") off of the substrate carrier more easily. Removing the liquid with particles from the substrate carrier tends to promote drying and rinsing of each of the substrates in a particle free manner.

The substrate support 249 provides lift and a contact point to each of the substrates 244 within the substrate carrier. To more easily appreciate the features of the substrate support, it should be noted that each of the substrates in a conventional substrate carrier touches the substrate carrier in at least three large regions. Each of the substrates is also relatively close to the insides of the substrate carrier. Accordingly, liquid easily accumulates and is often trapped on edges of each of the substrates.

To reduce this effect, the substrate support lifts the substrates in the substrate carrier by elevating each of the substrates in the carrier with a knife edge. By lifting each of the substrates in the substrate carrier, the substrate edges are further away from insides of the carrier, thereby allowing liquid to flow free from the region between the substrate edges and carrier insides. To further promote the removal of liquid from each of the substrates, the knife edge is preferably pointed, serrated, or any other shape that easily breaks the surface tension of the liquid at the bottom of each substrate. By breaking the surface tension of liquid at the substrate bottom edges, liquid flows free from the substrate bottom edges, thereby reducing the meniscus at such edges. The knife edge lifts each of the substrates at least 2 mm from the bottom insides of the carrier, and preferably lifts each of the substrates about 5 mm, but no more than about 20 mm. The substrate carrier support removes liquid such as water from the substrates, thereby decreasing the amount of water and in particular the particles in the water.

To add and drain liquid into the main chamber, and in particular the process region, the lower drain region 231 includes a fill inlet 232 and drain valve 236. The fill inlet provides liquid such as DI water and the like into the process region. The drain valve 236 removes liquid from the process region through the drain outlet 236. A plurality of drain holes 238 also exist at the bottom of the main chamber in the process region to distribute the liquid evenly therethrough. The lower drain region also includes an angled drain floor 237 at the bottom of the main chamber to facilitate liquid transfer, and a flat support surface 239 in the process region to support the substrate carrier support.

A cascade region 250 allows liquid to cascade out into cascade drain region 253. To rinse certain chemicals from the substrate carrier and substrates, ultra-purified DI water enters through the fill inlet 237, rises through the drain holes 238, flows through the process region 240, and cascades over a partition 252 into the cascade drain region 253. This sequence of steps removes excess chemicals such as acids or the like from the substrate carrier and substrates, and also keeps such chemicals from accumulating in the main chamber and in particular the process region.

Figure 4:
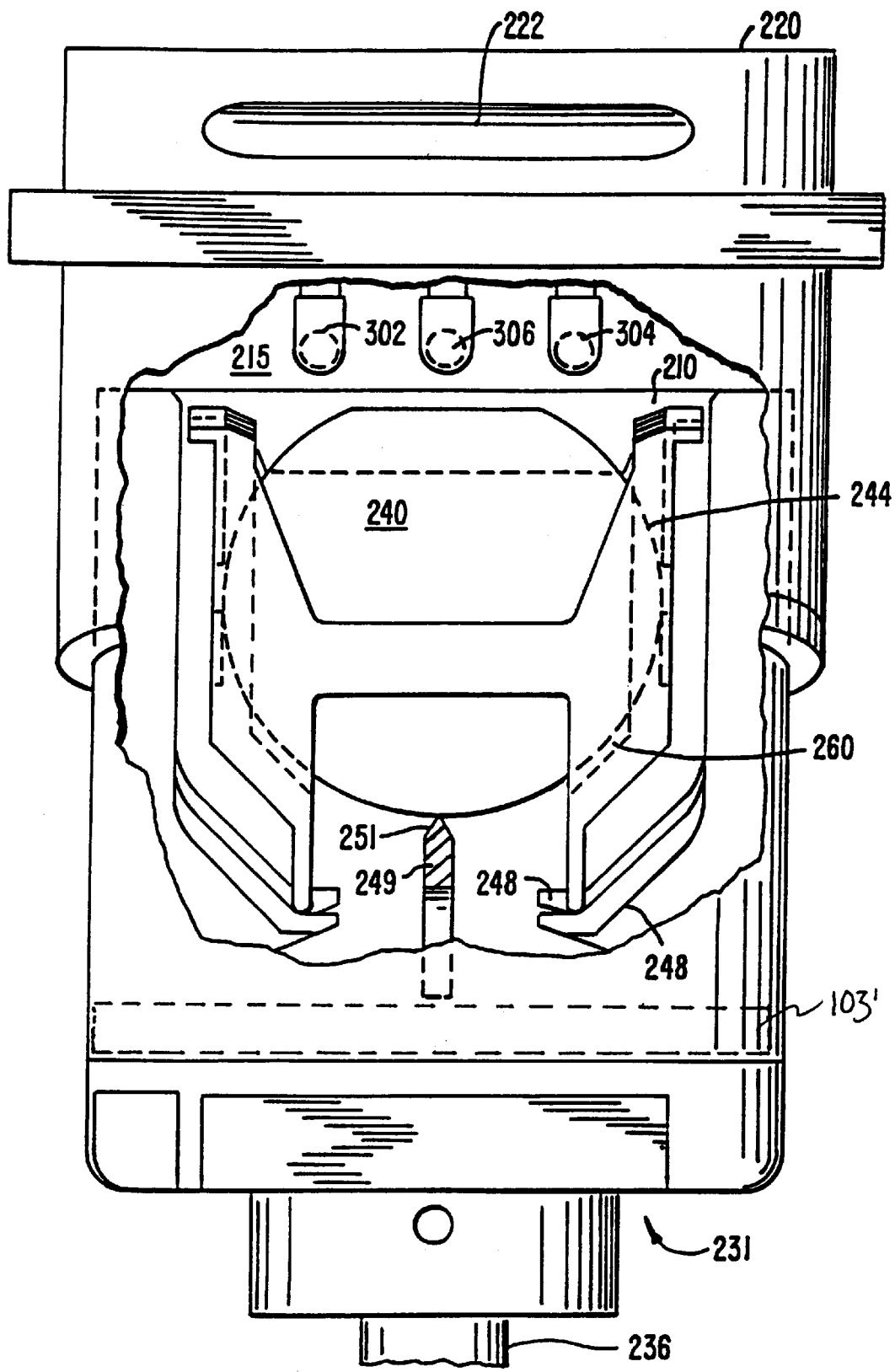
FIG. 4 is a simplified cross-sectional front-view of an embodiment of the cleaning chamber.

FIG. 4 illustrates a simplified front view of the cleaning chamber according to the present invention. For easy reading, FIG. 4 uses some of the same reference numerals as the FIG. 3 embodiment. The front-view embodiment shows elements such as the main chamber 210, the lid 220, the lower drain region 231, the process region 240, among others. The main chamber 210 includes the process region 240 and upper chamber region 215.

As shown, the substrate support 249 lifts each of the substrates from the substrate carrier to form a gap 260 between substrate edges and substrate carrier insides. The gap prevents liquid from accumulating between such substrate edges and substrate carrier insides. The gap is no greater than about 20 mm, but is larger than about 2 mm. The substrate support is a knife edge with triangular point 251. Other shapes may also be used to break the meniscus at the bottom of the substrate edges and remove water therefrom. The meniscus often forms at the bottom substrate and surface edges as liquid is being removed from the substrates. As previously noted, the meniscus often contains particles, often detrimental to the manufacture of an integrated circuit.

The front view also shows the substrate carrier supports 248. As shown, each of the substrate carrier support is arranged with different heights, typically lower to higher from one side of the process region to the other side of the process region. The different heights of the substrate carrier support tilt the position of the substrate carrier from horizontal. The tilt or angle of the substrate carrier also tilts the substrates, thereby preventing such substrates from sticking to each other during certain rinse and dry operations.

The front view further shows certain gas inlets 302, 304, and 306. Each of the gas inlets is a distribution plenum with a plurality of holes for distributing gas evenly over the process region. The embodiment includes two outside gas inlets 302 and 304, and a center carrier gas inlet 306. The two outside gas 302, 304 inlets generally introduce an ultra-pure non-reactive (e.g., non-oxidizing, non-reactive, inert, etc.) gas into the cleaning chamber. In some embodiments, the two outside gas inlets provide ultra-pure nitrogen to purge the main chamber from the environment, thereby creating an ultra-clean main process region, e.g., substantially free from particles. In these embodiments, the nitrogen gas (or absence of oxygen gas) is necessary or even critical to prevent the formation of oxidation on the substrate, e.g., semiconductor wafer, etc. The center inlet introduces the carrier gas comprising the cleaning enhancement substance. The non-reactive gas (or nitrogen) mixes with the carrier gas comprising cleaning enhancement substance in the cleaning chamber. By way of the ultra-pure non-reactive gas and carrier gas, the chamber is substantially free from particles greater than about 0.2 microns, and is preferably substantially free from particles greater than about 0.1 microns, thereby creating an ultra-pure and ultra-clean environment. The cleaning enhancement substance can also be introduced as a liquid in spray, stream, mist, or other forms. Of course, the number of inlets and their use depend upon the particular application.

Figure 5:
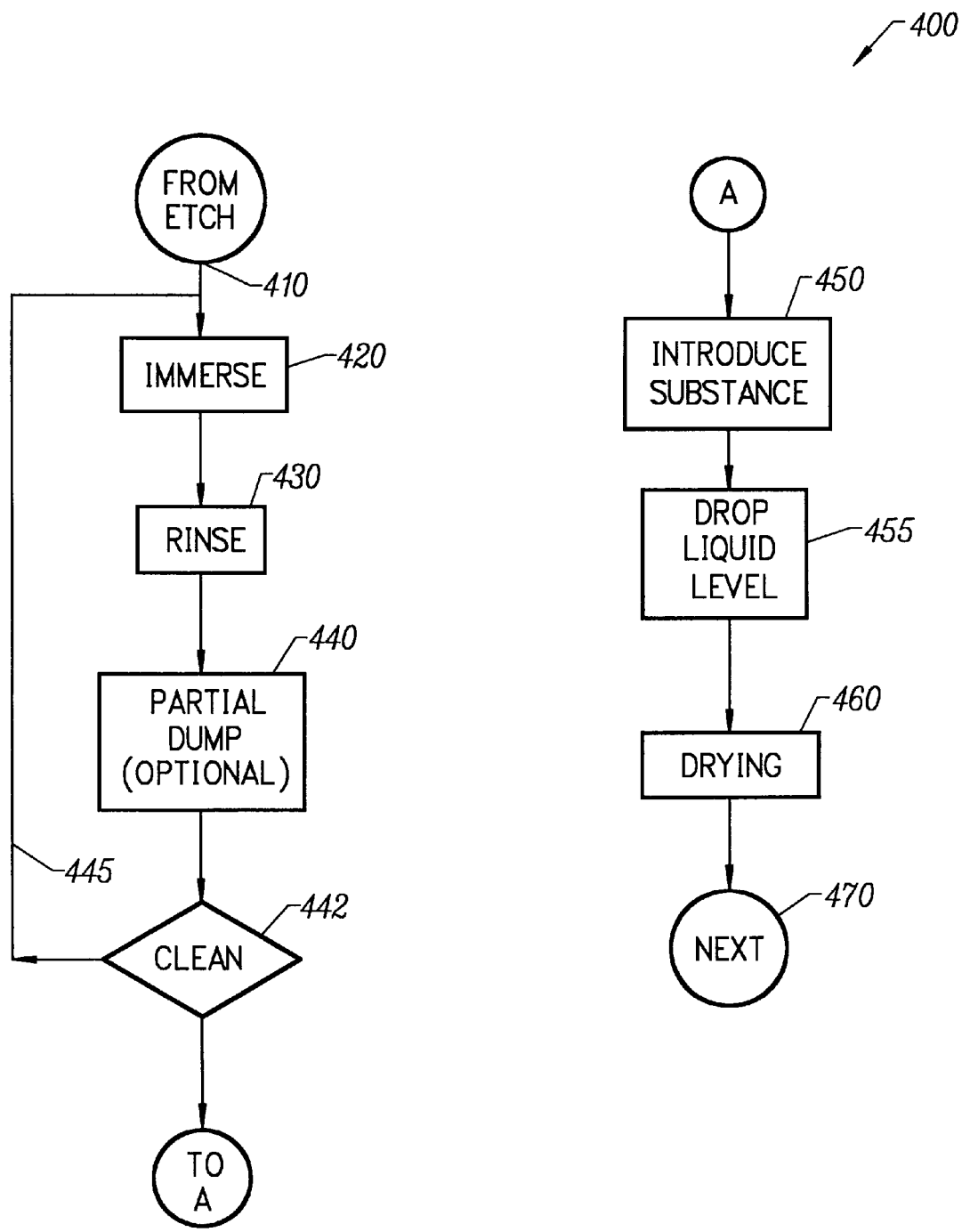
FIG. 5 is a simplified flow diagram of a cleaning method using fluid charging of a cleaning enhancement substance according to an embodiment of the present invention.

FIG. 5 is a simplified flow diagram 400 of an embodiment of a cleaning method according to the present invention. The diagram is merely an example and should not limit the scope of the claims herein. One of ordinary skill in the art would recognize other alternatives, modifications, and variations. The rinse method is illustrated as a cleaning method for a recently wet etched substrate, but can also be almost any substrate that requires cleaning. The wet etched substrate for illustrative purposes is etched in a solution of hydrofluoric acid ("HF") or buffered hydrofluoric acid ("BHF"). Hydrofluoric acid is often used to remove oxides from surfaces of a semiconductor wafer. As merely an example, this embodiment should not be taken as limiting the scope of the present invention.

The flow diagram begins 400 by receiving a recently etched substrate (etched wafer) 410 from the BHF etch. The etched substrate has no oxide layer thereon from the BHF etch, and is predominately hydrophobic in characteristic. A step 420 of immersing the etched substrate in the bath of ultra-purified DI water follows. The etched substrate is immersed into the DI water from the acid bath in about 5.0 seconds or less, and preferably about 2.5 seconds and less. The ultra purified DI water is substantially free from trace metals, micro organisms, and particles greater than about 0.05 microns in dimension.

The step of immersing the etched substrate immediately into the DI water substantially prevents formation of silicon dioxide from the oxygen in air, and promotes the formation of a thin but clean high grade silicon dioxide layer from the ultra-purified DI water. The DI water is substantially free from particles and therefore forms a substantially particle free silicon dioxide layer. The DI water can be at room temperature (e.g., 20° C.) or an elevated temperature, e.g., 25° C., 30° C., 40° C., 45° C., etc.

To remove acid such as the HF from the surface of the substrate, the ultra-purified DI water in the main chamber (or vessel) flows across the substrate and cascades over into a drain. The DI water cascade carries excess acid into the drain and reduces the acid concentration in the vessel. Optionally, the DI water in the vessel may be removed by dumping it (step 440) into a bottom drain dump. Preferably, the dumping step is a partial dump, and not a complete dump or removal of DI water. The dumping step can mechanically remove particles from the substrate. During the removal of the DI water, an ultra-pure gas (non-reactive) replaces the DI water. A typical gas includes filtered nitrogen and others. The filtered gas also is ultra-clean, e.g., substantially free from particles.

After replacing the DI water with the clean gas, clean DI water from the DI water source flows into the main chamber to cover the surface area of the substrate. These aforementioned steps may be repeated (branch 445) alone or in any combination until substantially no residual acid exists (test 442) on the substrate. When residual acid has been substantially removed from the substrate, a cleaning enhancement substance (e.g., trace amount of polar organic compound, ammonium, ammonium hydroxide, surfactant) is introduced (step 450) into the chamber. The cleaning enhancement substance can be introduced in liquid or vapor form, but is preferably introduced as a liquid. The cleaning enhancement substance generally forms a thin layer of such substance overlying the surface area or liquid level of the DI water that immerses the substrate. In an embodiment using an alcohol bearing compound, the alcohol bearing compound (e.g., isopropyl alcohol, methanol, ethanol) is often less than one liter per batch, which has about twenty gallons of DI water, but is not limited to such amount of DI water. In a specific embodiment, the amount of alcohol bearing compound can be about two cubic centimeters or one cubic centimeter of liquid for the twenty gallon batch, which can process a batch of twenty five wafers or more. Preferably, the alcohol bearing compound is introduced directly to the DI water as a liquid, but is not limited to such liquid form. In one embodiment using an ammonium bearing compound, for example, the ammonium can be anhydrous ammonia, which is made by way of the techniques described herein as well as others. The anhydrous ammonia can be made in-situ and is provided as a cleaning enhancement substance, which forms a thin layer overlying the liquid level or the DI water. In some embodiments, the cleaning enhancement substance diffuses from a higher concentration region, which is near the liquid level, toward the bulk DI water, which is away from the liquid level.

Figure 5A:
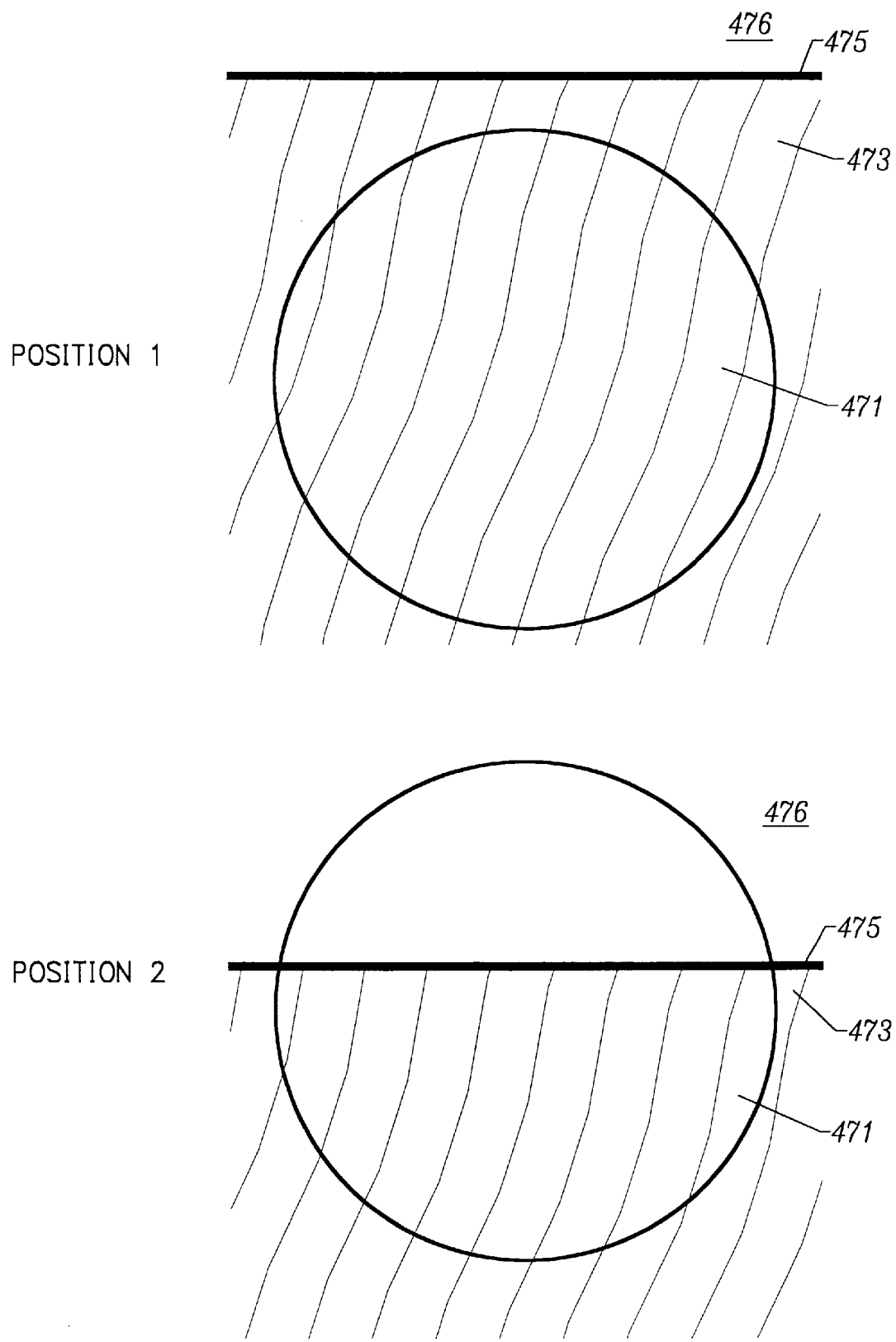
FIG. 5A is a simplified cross-sectional view diagram of a substrate according to FIG. 5.

FIG. 5A is a simplified cross-sectional view diagram of a substrate according to FIG. 5. This diagram is merely an example and should not limit the scope of the claims herein. One of ordinary skill in the art would recognize other variations, modifications, and alternatives. The diagram shows a substrate in a first position ("position 1"), where the substrate is completely immersed, and a second position ("position 2"), where the liquid level is dropping down along a face of the substrate. As shown in position 1, the substrate 471 is immersed in liquid 473, which comprises DI water. In particular, the substrate, including edges and faces, is completely in the liquid. The liquid includes a thin film of cleaning enhancement substance 475 overlying an upper surface of the liquid. The cleaning enhancement substance can be a variety of fluids that tend to assist in removing liquid and particulates from surfaces of the substrate. The substance can be an alcohol (e.g., isopropyl, reagent, methanol, ethanol), ammonium bearing compound (e.g., ammonium hydroxide), surfactant, and other compounds. A space above the film includes ultra-clean gas 476. The ultra-clean gas can be substantially dry and free from particulate contamination. The gas also can be free from any vapors and the like.

As the liquid level drops, as shown in position 2, a portion of the substrate 471 becomes exposed to the ultra-clean gas 476. The cleaning enhancement substance 475 tends to increase an ability of the liquid to be removed from surfaces of the substrate. As an analogy, the cleaning enhancement substance removes particles and droplets of liquid from the substrate, similar to the use of alcohol in "sheeting" rain or/and cleaning "dirt and grime" from a windshield of an automobile during a rainstorm. It is believed that the thin layer of cleaning enhancement substance, which can be, for example, a mono layer of compounds, increases an ability of liquid and particles to be removed from surfaces of the substrate.

Once the cleaning enhancement substance is provided to form the thin layer of fluid overlying the surface of the DI water, liquid is removed from the substrate, step 455. In a specific embodiment, liquid is removed by lowering the liquid level of the DI water, including the film, by draining the liquid through an orifice, which can be at a lower portion of the chamber. The liquid level can be lowered using a constant velocity in one embodiment. In the constant velocity embodiment, the liquid level drops at a rate of about 5 or 4 mm/sec. or less, or 2.5 mm/sec. or less, or 1 mm/sec. or less, along a face of the substrate. Alternatively, the liquid level can be dropped at a varying rate in some embodiments.

An ultra-clean gas can be used to replace the liquid as the liquid level drops. The ultra-clean gas can be ultra-clean nitrogen gas, for example. The ultra clean gas can be substantially dry. The ultra clean gas can also be a mixture of gases. Additionally, the ultra-clean gas can be substantially free from particles greater than about 0.05 micron, or 0.01 micron, or 0.005 micron or 0.0001 micron in dimension. The ultra clean gas replaces the DI water and prevents additional particles from coming in contact with the surface of the substrate, which have been cleaned. Additionally, the ultra clean gas can even completely dry surfaces, including an edge, of the substrate by evaporation.

In certain embodiments, a thin boundary layer of liquid still remains on the substrate face after liquid is removed from the chamber. This boundary layer often ranges from about 1,000 Å and less and is preferably 500 to about 50 Å, and is more preferably at about 100 Å and less. In one embodiment using isopropyl alcohol as the polar organic compound, the boundary layer is about 500 Å and less. In an embodiment using 1-methoxy-2-propanol, the boundary layer is about 100 Å and less. A further drying step can be used to evaporate such boundary layer.

A step of drying (step 460) is performed on the substrate and carrier for further drying, if necessary. The step of drying substantially removes all liquid droplets adhering to surfaces such as substrate edges, carrier edges, and the like. In one embodiment, drying occurs by pulse flow drying. The step of pulse flow drying occurs by way of high velocity flow apparatus 600 illustrated in FIGS. 6, 6A, and 6B. The high velocity flow apparatus can be adapted into the present rinse chamber 200 among other systems. The high velocity flow apparatus includes a plurality of nozzles 601 directed over a substrate carrier 242. The substrate carrier 242 includes a plurality of substrates 244, each having residual amounts of liquid at their edges. Each substrate may have a liquid volume ranging from about 1.0 milliliter to about 0.2 milliliter but is preferably less than about 0.5 milliliter. The plurality of nozzles 601 is defined by a first set of nozzles 603 (first nozzle set), a second set of nozzles 605 (second nozzle set), and others.

The first nozzle set 603 is directed to the front side 607 of the substrates 244. The first nozzle set directs drying fluid at substrate edges 609 adjacent to the substrate carrier sides 246. The drying fluid can be any suitable fluid capable of removing liquid from the substrate edges and substrate surfaces. The drying fluid is preferably ultra-pure nitrogen and the like, but may also be a variety of other gases or gaseous mixtures. The first nozzle set preferably includes at least two nozzles, each placed at a location to direct drying fluid towards the substrate edges 609 adjacent to the substrate carrier sides. In the first nozzle set, a first nozzle A1 611 is directed to the substrate edges 609 at one side of the substrate carrier, and a second nozzle A2 615 is directed to the substrate edges 609 at the other side of the substrate carrier.

The second nozzle set 605 is directed to the back side 619 of the substrates 244. The second nozzle set directs drying fluid at substrate edges 609 adjacent to the substrate carrier sides 246. The second nozzle set preferably includes at least two nozzles, each placed at a location to direct drying fluid towards the substrate edges adjacent to the substrate carrier sides. In the second nozzle set, a first nozzle B1 621 is directed to the substrate edges at one side of the substrate carrier, and a second nozzle B2 625 is directed to the substrate edges at the other side of the substrate carrier.

Figure 6:
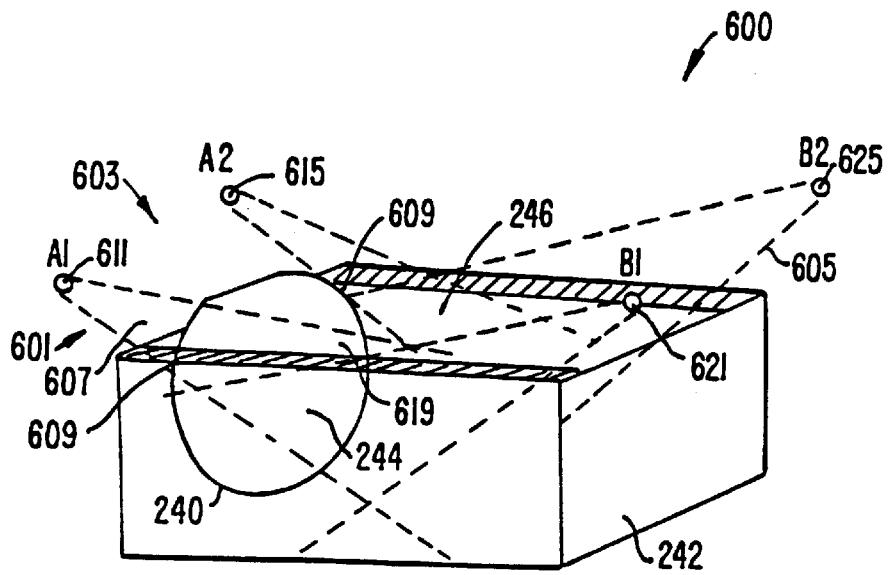
FIG. 6 is a simplified diagram of a high velocity flow apparatus according to an embodiment of the present invention.
Figure 7:
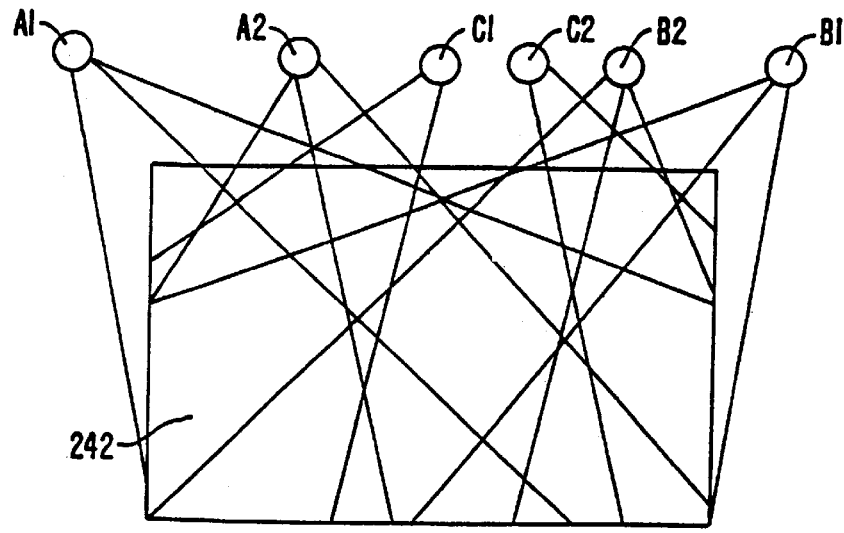
FIGS. 7 and 8 are simplified fluid flow diagrams of the high velocity flow apparatus of FIG. 6.
Figure 8:
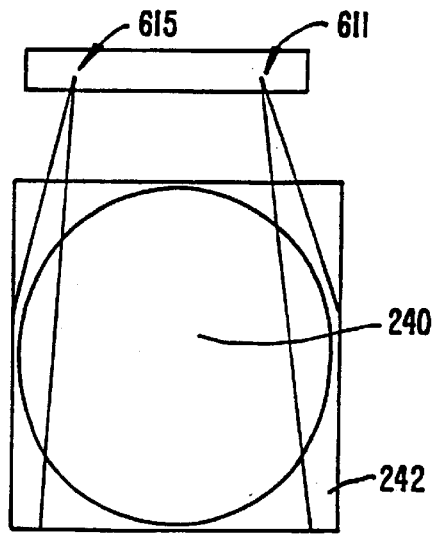

The nozzle can be any suitable nozzle capable of enabling the drying fluid to flow over the substrate edges and remove liquid therefrom as illustrated by fluid flow distribution patterns in FIGS. 7 and 8. FIG. 7 illustrates a simplified side-view diagram of the apparatus of FIG. 6 according to the present invention. As shown, nozzles A1, A2, B2, and B3 direct drying fluid at the substrate edges (not shown) to preferably cover the inner surface area of the substrate carrier 242. Optionally, the apparatus can also include additional nozzles C1 and C2. Nozzles C1 and C2 are directed toward the substrate carrier front and back sides.

Figure 6A:
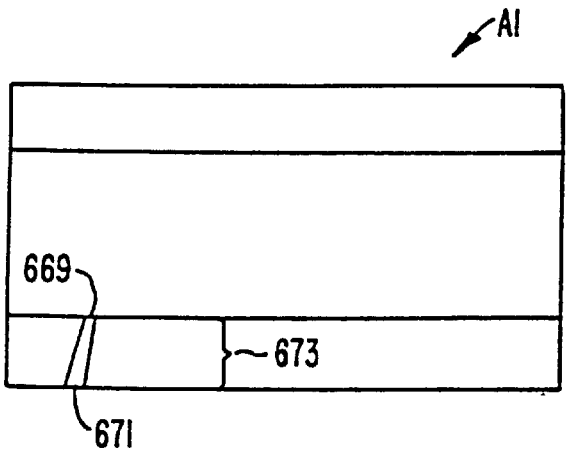
FIGS. 6A and 6B illustrate simplified diagrams of a nozzle according to an embodiment of the present invention.
Figure 6B:
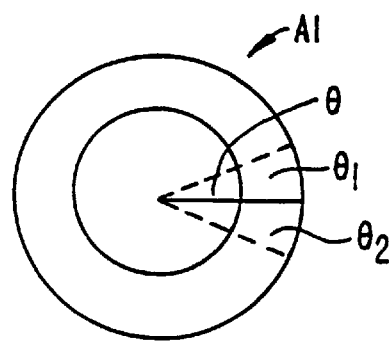

FIG. 8 illustrates a simplified front-view diagram of the nozzles A1 and A2 for the apparatus of FIG. 6 according to the present invention. Nozzles A1 and A2 direct drying fluid at the substrate edges along a front portion of the substrates. The nozzle is preferably narrow and long to produce a fluid flow at high velocity to cover the desired number of substrates. Each nozzle produces a fluid flow of, for example, nitrogen gas ranging from about 250 to about 350 standard cubic feet per hour, and is preferably about 300 standard cubic feet per hour. The pressure of the nitrogen gas at the nozzle opening ranges from about 80 to about 90 psia, and is preferably about 85 psia. A nozzle Al also includes an opening 669 having a width of about 0.025 inch and a height of about 0.375 inch 673 as illustrated in FIGS. 6A and 6B. As shown, FIG. 6A illustrates a simplified cross-sectional side view of the nozzle, and FIG. 6B illustrates a simplified cross-sectional front view of the nozzle. The nozzle opening 671 includes an angle $\theta$ ranging from about 20 degrees to about 80 degrees, but is preferably about 75 degrees and less. The angle $\theta$ may also be defined by a first angle $\theta 1$ and second angle θ2. The first angle may be different from the second angle but can also be the same. Of course, other flow rates, pressures, and nozzle dimensions can be used depending upon the particular application.

Each nozzle is positioned to direct drying fluid to the substrate edges and portions of the substrate surface. The nozzle is directed to an inner edge of the substrate carrier to promote the removal of liquid between the substrate edges and the carrier sides. The nozzle is defined between about 0.5 inch to about 2 inches from an outside edge of the substrate carrier. The nozzle is placed at an angle from about 5° to about 85°, and is preferably about 45° from a line perpendicular from the substrate surface. Of course, the exact angle used depends upon the particular application.

Drying occurs by directing drying fluid from the first nozzle set and the second nozzle set in an alternating sequence against the substrate edges and portions of the substrate surfaces. For example, the first nozzle set sends a pulse of drying fluid against the substrate edges and portions of the front substrate surfaces, then the second nozzle set sends a pulse of drying fluid from the opposite direction against the substrate edges and portions of the back substrate surface. The drying fluid pulses from the first nozzle set and the second nozzle set alternate until no more liquid remains on the substrate edges.

In removing water from the substrate edges, the second nozzle set has a pulse duration which is longer than the pulse duration of the first nozzle set. Water adheres on the backside of the substrate and substrate edges on a conventional semiconductor wafer with a greater attractive force than the front-side of the substrate. Accordingly, it is often preferable to have a pulse duration at the second nozzle set which is at least two times longer than the pulse duration at the first nozzle set. The pulse duration at the second nozzle set can also be three times longer or more than the pulse duration at the first nozzle set. The pulse duration for the first nozzle set ranges from about 1 to 3 seconds and greater, and the pulse duration for the second nozzle set ranges from about 2 to 6 seconds and greater. The number of pulses is preferably greater than 5 for each substrate side for a total of about 30 seconds of total pulsing time. Of course, other selected pulses among the first and second nozzle sets may also be performed, depending upon the particular application.

Optionally, pulse flow drying is followed by flowing hot nitrogen gas over the substrate carrier (step 470). The hot nitrogen gas is ultra-pure nitrogen gas with a temperature at about 70° F. and is preferably greater than 150° F., but no greater than 200° F. The combination of hot nitrogen and pulse flow drying reduces actual drying time by about one half, as compared to drying solely by means of hot nitrogen and the like. Alternatively, a drying gas such as nitrogen can be used alone to dry the wafer. Of course, other carrier gases and combinations thereof may also be used depending upon the particular application.

Figure 9:
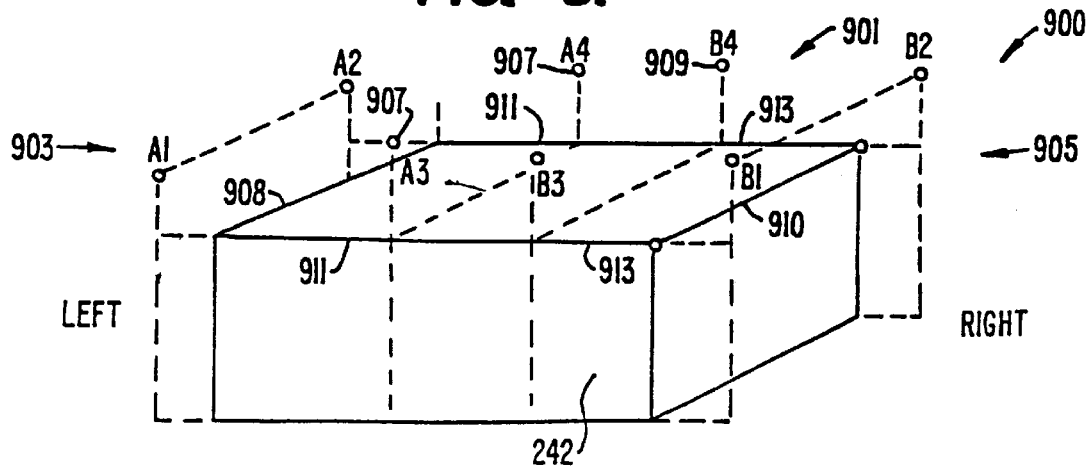
FIG. 9 is a simplified diagram of an alternative embodiment of the high velocity flow apparatus according to the present invention

FIG. 9 is a simplified diagram of an alternative embodiment of the high velocity flow apparatus 900 according to the present invention. The high velocity flow apparatus includes a plurality of nozzles 901 directed over a substrate carrier 242. The substrate carrier 242 includes a plurality of substrates 244 (not shown), each having residual amounts of liquid at their edges. Each substrate may have a liquid volume ranging from about 1.0 milliliter to about 0.2 milliliter but is preferably less than about 0.375 milliliter. The plurality of nozzles 901 is defined by a first set of nozzles 903 (first nozzle set), a second set of nozzles 905 (second nozzle set), a third set of nozzles 907 (third nozzle set), a fourth set of nozzles 909 (fourth nozzle set), and others.

The nozzles are placed at selected locations surrounding the substrate carrier, and in particular the substrates disposed in the substrate carrier. The first nozzle set A1, A2 is placed at an end 908 of the substrate carrier facing the substrate faces, and the second nozzle set B1, B2, is placed at the other end 910 of the substrate carrier facing the back-side of the substrates. The third nozzle set includes nozzles A3, A4 which face each other and are disposed adjacent to a first portion 911 of the substrate carrier edges. The fourth nozzle set includes nozzles B3, B4 also face each other and are disposed adjacent to a second portion 913 of the substrate carrier edges. The design of each nozzle is similar to the previous embodiment, but each nozzle covers less area than the previous embodiment.

In removing residual water from the substrates, each set of nozzles is pulsed in a selected pattern. For example, the pulse pattern begins by pulsing drying fluid at nozzles A1, A2 followed by nozzles A3, A4 followed by nozzles B1, B2 followed by nozzles B3, B4, and the sequence repeats as often as it is necessary to remove substantially all water from the substrate. Alternatively, the pulse pattern begins at nozzles B3, B4 followed by nozzles B1, B2 followed by nozzles A3, A4 followed by nozzles A1, A2, and the sequence then repeats as often as it is necessary to remove substantially all water from the substrate.

Optionally, the pulse drying is followed by flowing hot nitrogen gas over the substrate carrier. The hot nitrogen gas is ultra-pure nitrogen gas with a temperature at about 70° F. and is preferably greater than 150° F., but no greater than 200° F. The hot nitrogen gas flows over the substrates for a period of time of at least 30 seconds and more, or preferably 50 seconds and more. The combination of hot nitrogen and pulse drying reduces actual drying time by about one half, as compared to drying solely by means of hot nitrogen and the like. The pulse drying step removes or evaporates liquid from the boundary layer. Pulse drying also removes or evaporates liquid on edges of the substrate. Alternatively, hot nitrogen gas alone can be used to dry the wafer. Of course, other carrier gases and combinations thereof may also be used depending upon the particular application.

Another method to rinse and dry HF etched substrate includes a selected sequence of the aforementioned steps. A solution of HF etches silicon dioxide off the semiconductor substrate. To stop etching, the substrate is quickly immersed into ultra-pure DI water in a vessel. After immersing the etched substrate into the DI water, the vessel is purged with filtered nitrogen gas. The nitrogen gas flows at a rate of ranging from about 1 cubic feet/min. to about 10 cubic feet/min., and is preferably at about 2 cubic feet/min.

To further rinse and remove acid from the substrate, DI water flows past the substrate and cascades from a top portion of the vessel into a drain to cascade rinse the substrate. A quick dump follows the cascade rinse. Preferably, the quick dump occurs at a rate where the liquid level drops at a rate greater than about 20 mm/sec. as measured from a substrate face. During the quick dump, clean nitrogen gas replaces the DI water, thereby preventing any oxidation of the substrate from air. Clean DI water fills the vessel and replaces the nitrogen to re-immerse the substrate in the DI water.

A combination of a cleaning enhancement substance overlying the liquid or in the liquid and the DI water removes substantially all acid off the substrate. The slow replacement step substantially eliminates any water from the substrate edges (a meniscus). After another sequence of quick DI water fills and partial dumps, another clean liquid mixture and cleaning enhancement substance removes liquid and particulates from the substrate. Substantially all water is removed from the substrate at this time. In some embodiments, it is believed that the cleaning enhancement substance reduces the surface tension of the liquid on the substrate to enhance fluid flow therefrom. During removal of the liquid, it pulls particles off the substrate surfaces, thereby cleaning the substrate. A head space overlying the liquid is filled with ultra clean gas that is filtered. In some embodiments, the ultra clean gas is substantially dry, which facilitates drying of the substrate through evaporation. To further dry the substrate and carrier, warm or hot nitrogen is pulsed into the vessel. The nitrogen includes a temperature ranging from about 70° F. to about 250° F. Preferably, the nitrogen is clean filtered nitrogen or other non-reactive gas, which has an elevated temperature, which is above room temperature.

The aforementioned methods also include the use of a certain substrate support and a substrate carrier support to enhance wicking or to draw liquid away from the substrate and carrier. For example, the substrate support includes a knife edge that lifts the substrates to prevent accumulation of water at the substrate edges, and in particular the substrate bottom edges. The substrate carrier support wicks or draws the water from the surface of the substrate carrier, and also puts a slight tilt from horizontal on such carrier.

The slight tilt of the substrate carrier also tilts the substrates, which tends to prevent them from sticking to each other. As previously noted, sticking substrates often accumulate water therebetween. The accumulation of water also accumulates particles, which may be in the water. By removing the water and particles from the substrate, the present method provides higher device yields on a typical semiconductor substrate.

In one embodiment, the aforementioned cleaning method occurs without movement of the substrate. In fact, the substrate carrier remains substantially stationary after being immersed, and during the drying, cascade rinse, and other steps. By way of less movement, the system has fewer mechanical parts and is often easier to use and maintain than certain prior art systems.

Moreover, the amount of polar organic compound used for each batch of substrates is typically less than a fraction of a milliliter or a few milliliters. The use of less organic compounds is often advantageous to the highly flammable prior art methods of drying a substrate by way of IPA for example. In certain embodiments, no polar organic compounds or the like are used. Accordingly, the present method is less hazardous than certain prior art methods to both health and environment.

The aforementioned embodiments also are used in other selected semiconductor fabrication process steps. In one embodiment, the cleaning technique occurs in pre-gate oxide cleans. Pre-gate oxide cleans were generally not performed due to the sensitivity of gate oxide layer formation. That is, convention pre-gate oxide cleans were not performed due to the introduction of particles onto the semiconductor substrate. The present technique, however, actually removes any particles that may remain on the surfaces of the substrate before gate oxide layer formation, thereby improving the general quality of the gate oxide layer. The present technique removes substantially all particles greater than about 0.5 microns, and preferably 0.2 microns, and more preferably 0.1 microns.

In an alternative specific embodiment, the present cleaning technique can be applied before other semiconductor process applications. These process applications are described in great detail in a text written by Stanley Wolf and Richard N. Tauber, Semiconductor Processing For The VLSI Era, Vol. 1: Process Technology (1986) (herein "WOLF"). For example, the present technique is applied as a pre-epitaxial, pre-diffusion, pre-metal, pre-poly, pre-implant, pre-photoresist, and pre-stack oxide cleaning techniques. Generally, the present cleaning technique can be applied at room temperature with trace quantities of polar organic compound. The trace quantity of polar organic compound at room temperature does not generally detrimentally influence the semiconductor or photoresists. As noted in the background of invention, photoresists often dissolve during high temperature processing using solvents. As also previously noted, the present technique actually removes particles, rather than introducing them.

In an alternative embodiment, the present cleaning technique can be applied after performing a selected semiconductor fabrication process. An example of this fabrication process includes nitride deposition, polish cleans (e.g., CMP), buffered oxide etches, and metal deposition. These process steps also are described in great detail in a text written by WOLF. Additional applications of the present cleaning technique also can be applied for hydrofluoric acid last recipes and critical metal oxide silicon etches. As previously noted, the present technique actually removes particles from the semiconductor, rather being another process that introduces them.

While the above is a full description of the specific embodiments, various modifications, alternative constructions, and equivalents may be used. For example, while the description above is in terms of a method and apparatus for semiconductor substrates, it would be possible to implement the present invention to the manufacture of raw wafers, disks and heads, flat panel displays, microelectronic masks, and other applications requiring high purity wet processing such as steps of rinsing, drying, cleaning, and the like. In addition, the systems of the FIGS. are in terms of a cleaning system for semiconductors. A skilled artisan may, alternatively, employ such systems to other industries such as electrochemical, pharmaceutical, printed circuit board, optical devices, and any other industry that needs an improved technique to rinse and dry an article of manufacture.

Therefore, the above description and illustrations should not be taken as limiting the scope of the present invention which is defined by the appended claims.

What is claimed is:

1. A method for cleaning an object comprising:
   immersing an object in a liquid comprising water with said liquid defining a liquid level, said object including a face and an edge;
   providing a cleaning enhancement substance onto said liquid, said cleaning enhancement substance forming a film of said cleaning enhancement substance overlying said liquid level of said liquid; and
   providing a substantially particle free environment adjacent to said face of said object as said liquid, including said film of said cleaning enhancement substance, is being removed relative to said object;
   wherein said cleaning enhancement substance dopes said liquid which is attached to said face of said object to cause a concentration gradient of said cleaning enhancement substance in said liquid to accelerate fluid flow of said liquid off of said object.

2. The method of claim 1 further comprising introducing a drying source adjacent to said object, said drying source removing any remaining liquid attached to said edge to substantially dry said object.

3. The method of claim 1 wherein said cleaning enhancement substance is selected from a group consisting of a surfactant, isopropyl alcohol, di-acetone alcohol, ammonium, and 1-methoxy-2-propanol.

4. The method of claim 1 wherein said liquid during said providing said cleaning enhancement substance removes particles off said face of said object as said liquid level is being lowered relative to said object.

5. The method of claim 1 wherein said liquid is substantially free from particles greater than about 0.2 microns in diameter and less.

6. The method of claim 1 wherein said cleaning enhancement substance is in the form of a vapor.

7. The method of claim 1 wherein said cleaning enhancement substance is in liquid form that is introduced to said liquid.

8. The method of claim 1 wherein said object is at an angle from a vertical position relative to a substrate carried.

9. The method of claim 1 wherein said object is selected from a wafer, a disk, a mask, and a panel.

10. The method of claim 1 wherein said object is a recently etched wafer.

11. The method of claim 1 wherein said object is substantially stationary during said providing said substantially particle free environment.

12. The method of claim 1 wherein said cleaning enhancement substance is less than ten milliliter s of alcohol for a batch of twenty five wafers.

13. The method of claim 1 wherein said cleaning enhancement substance is an amount of polar organic compound ranging in concentration from about 1000 ppm and less.

14. The method of claim 1 wherein said liquid is removed at a constant rate of about 5.0 mm/sec. or less as measured along said face of said object.

15. The method of claim 1 wherein said liquid is removed at a rate between about 0.25 mm/sec. and 5.0 mm./sec. as measured along said face of said object.

16. The method of claim 1 wherein said liquid is removed at a rate between about 0.5 mm/sec. and 2.5 mm./sec. as measured along said face of said object.

17. The method of claim 7 wherein a portion of said particles are each substantially less than about 0.2 microns in diameter.

18. The method of claim 12 wherein said angle is less than about 15 degrees.

* * * * *